(12) United States Patent
Lai et al.

(10) Patent No.: US 8,089,798 B2
(45) Date of Patent: Jan. 3, 2012

(54) METHOD FOR OPERATING ONE-TIME PROGRAMMABLE READ-ONLY MEMORY

(75) Inventors: Tsung-Mu Lai, Hsinchu County (TW);
Shao-Chang Huang, Hsinchu (TW);
Wen-hao Ching, Hsinchu County (TW);
Chun-Hung Lu, Yunlin (TW);
Shih-Chen Wang, Taipei (TW);
Ming-Chou Ho, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 138 days.

(21) Appl. No.: 12/627,244

(22) Filed: Nov. 30, 2009

(65) Prior Publication Data
US 2010/0073985 A1    Mar. 25, 2010

Related U.S. Application Data

(62) Division of application No. 11/956,633, filed on Dec. 14, 2007, now abandoned.

(60) Provisional application No. 60/940,666, filed on May 29, 2007.

(51) Int. Cl.
*G11C 17/00* (2006.01)
(52) U.S. Cl. ............... 365/94; 365/104; 365/105
(58) Field of Classification Search .............. 365/94, 365/96, 104, 225.7
See application file for complete search history.

(56) References Cited

U.S. PATENT DOCUMENTS

| 4,507,757 | A  | * | 3/1985  | McElroy ............ 365/104 |
| 5,019,878 | A  | * | 5/1991  | Yang et al. ............ 257/390 |
| 5,337,274 | A  | * | 8/1994  | Ohji ............ 365/185.01 |
| 5,672,994 | A  | * | 9/1997  | Au et al. ............ 327/525 |
| 6,798,693 | B2 | * | 9/2004  | Peng ............ 365/177 |
| 6,897,543 | B1 | * | 5/2005  | Huang et al. ............ 257/530 |
| 6,920,771 | B1 | * | 7/2005  | Griffith ............ 70/225 |
| 2005/0269663 | A1 | * | 12/2005 | Minami et al. ............ 257/510 |

FOREIGN PATENT DOCUMENTS

WO    WO 2005109516 A1 * 11/2005

* cited by examiner

*Primary Examiner* — Alexander Sofocleous
(74) *Attorney, Agent, or Firm* — J. C. Patents

(57) ABSTRACT

A method for operating a one-time programmable read-only memory (OTP-ROM) is provided. The OTP-ROM comprises a first gate and a second gate respectively disposed on a gate dielectric layer between a first doped region and a second doped region on a substrate, wherein the first gate is adjacent to the first doped region and coupled to the first doped region, the second gate is adjacent to the second doped region, the first gate is electrically coupled grounded, and the OTP-ROM is programmed through a breakdown effect. The method comprises a step of programming the OTP-ROM under the conditions that a voltage of the second doped region is higher than a voltage of the first doped region, the voltage of the second gate is higher than a threshold voltage to pass the voltage of the second doped region, and the first doped region and the substrate are at a reference voltage.

4 Claims, 4 Drawing Sheets

METHOD FOR OPERATING ONE-TIME PROGRAMMABLE READ-ONLY MEMORY

CROSS-REFERENCE TO RELATED APPLICATION

This application claims the priority benefit of U.S. application Ser. No. 11/956,633, filed on Dec. 14, 2007, which claims the priority benefit of U.S. provisional application Ser. No. 60/940,666, filed on May 29, 2007. The entirety of each of the above-mentioned patent applications is hereby incorporated by reference herein and made a part of this specification.

BACKGROUND OF THE INVENTION

1. Field of the Invention

The present invention relates to a method for operating a memory, and more particularly to a method for operating a one-time programmable read-only memory (OTP-ROM).

2. Description of Related Art

As functions of microprocessors continue to be expanded, an amount of computation in a given software program increases exponentially, and demands for memories are also increasing. As a result, it is an essential issue for semiconductor manufacturers to satisfy said demands by fabricating the inexpensive memories with great storage capacity. According to differences in read/write functions, the memories can be simply categorized into read-only memories (ROMs) and random access memories (RAMs). As the name suggests, the ROMs merely perform the read function, while the RAMs are equipped with both the read function and the write function. On the other hand, the ROMs can be classified into mask ROMs, programmable ROMs (PROMs), erasable programmable ROMs (EPROMs), and electrically erasable programmable ROMs (EEPROMs) based on a way by which data are stored in the memories. RAMs can be divided into static RAMs (SRAMs) and dynamic RAMs (DRAMs) according to a way by which the data are processed in the memories.

Recently, among various integrated circuit (IC) devices in the semiconductor industry, OTP-ROMs characterized in that the data stored therein do not disappear even though the power is low have become indispensable. The OTP-ROMs may be extensively applied to perform a redundant function in the memories having great storage capacity, such as the DRAMs or the SRAMs. Besides, the OTP-ROMs may also be utilized for performing a calibrating function for analog circuits, a code storage function for low keys, a data storage chip identification (ID) function for managing a fabrication process, and so forth.

SUMMARY OF THE INVENTION

In view of the foregoing, the present invention is directed to a method for operating an OTP-ROM which is novel and is able to store data effectively.

The present invention is further directed to a method for operating an OTP-ROM which is capable of preventing data errors when performing a read function.

The present invention provides a method for operating an OTP-ROM including a substrate, a first doped region, a second doped region, a gate dielectric layer, a first gate, and a second gate. The substrate is of a first conductive type. The first doped region and the second doped region are of a second conductive type and are separately disposed in the substrate. The gate dielectric layer is disposed on the substrate between the first doped region and the second doped region. The first gate and the second gate are disposed on the gate dielectric layer, respectively. The first gate is adjacent to the first doped region and coupled to the first doped region, while the second gate is adjacent to the second doped region. Here, the first gate is electrically coupled grounded, and the OTP-ROM is programmed through a breakdown effect. The method comprises a step of programming the OTP-ROM under the conditions that a voltage of the second doped region is higher than a voltage of the first doped region, the voltage of the second gate is higher than a threshold voltage to pass the voltage of the second doped region, and the first doped region and the substrate are at a reference voltage.

According to an embodiment of the present invention, the method comprises a step of reading the OTP-ROM under the conditions that a voltage of the second doped region is set at a reading voltage, the voltage of the second gate is higher than a threshold voltage to pass the voltage of the second doped region, and the first doped region and the substrate are at a reference voltage.

The present invention provides another method for operating an OTP-ROM including a substrate, a first doped region, a second doped region, a gate dielectric layer, a first gate, and a second gate. The substrate is of a first conductive type. The first doped region and the second doped region are of a second conductive type and are separately disposed in the substrate. The gate dielectric layer is disposed on the substrate between the first doped region and the second doped region. The first gate and the second gate are disposed on the gate dielectric layer, respectively. The first gate is adjacent to the first doped region and coupled to the first doped region, while the second gate is adjacent to the second doped region. Here, the first gate is electrically coupled grounded, and the OTP-ROM is programmed through a breakdown effect. The method comprises a step of programming the OTP-ROM under the conditions that a voltage of the second doped region is higher than a voltage of the first doped region, the voltage of the second gate is higher than a threshold voltage to pass the voltage of the second doped region and a triggering current to be sunk by the first doped region, and the substrate is at a reference voltage.

According to another embodiment of the present invention, the method comprises a step of reading the OTP-ROM under the conditions that a voltage of the second doped region is set at a reading voltage, the voltage of the second gate is higher than a threshold voltage to pass the voltage of the second doped region, and the first doped region and the substrate are at a reference voltage.

Based on the foregoing, in the OTP-ROM of the present invention, the voltages are applied to the doped regions result in occurrence of the breakdown effect between the first gate and the first doped region (a drain) and/or between the second doped region (a source) disposed below the first gate and the first doped region (the drain), so as to program the OTP-ROM.

Moreover, with a select gate, the OTP-ROM of the present invention can effectively control currents entering the OTP-ROM, so as to avoid the unnecessary breakdown effect and to properly store the data. Moreover, the select gate is capable of preventing data errors when performing the read function on the OTP-ROM.

In order to the make the aforementioned and other objects, features and advantages of the present invention comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
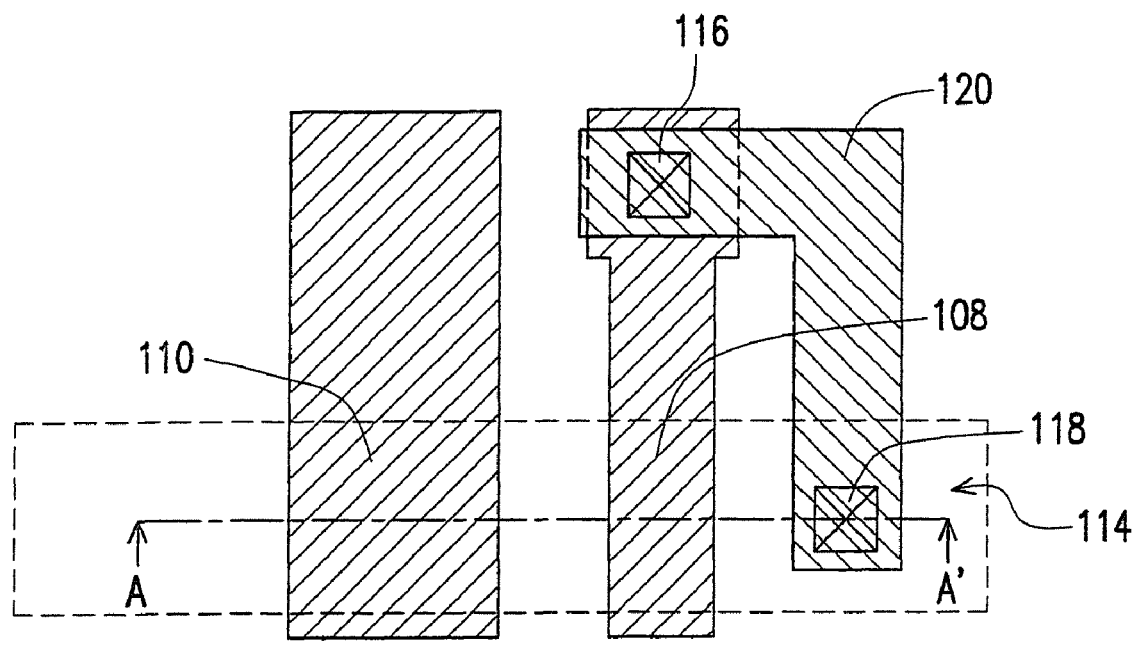
FIG. 1 is a top view of an OTP-ROM according to a first embodiment of the present invention.
Figure 2:
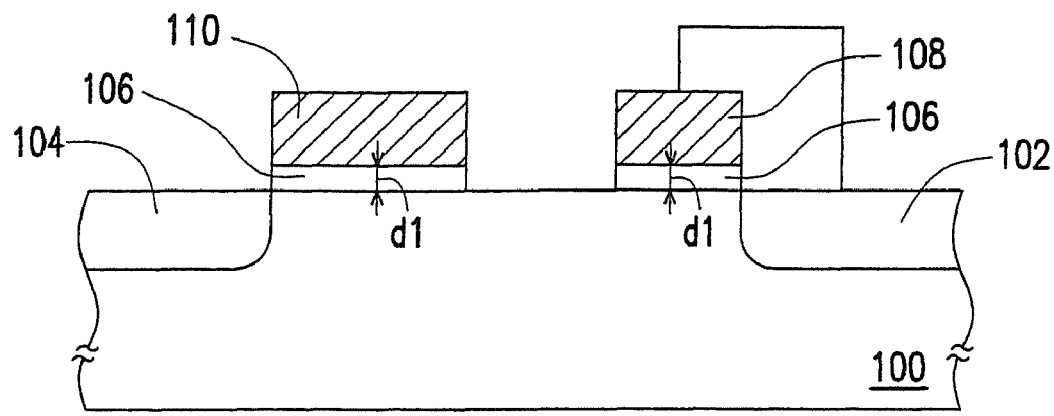
FIG. 2 is a cross-sectional view along line A-A' in FIG. 1.

FIG. 1 is a top view of an OTP-ROM according to a first embodiment of the present invention. FIG. 2 is a cross-sectional view along line A-A' in FIG. 1.

Referring to FIGS. 1 and 2, the OTP-ROM includes a substrate 100, a doped region 102, a doped region 104, a gate dielectric layer 106, a gate 108, and a gate 110. The OTP-ROM is an N-type memory cell or a P-type memory cell. In the present embodiment, the OTP-ROM is the N-type memory cell, for example.

The substrate 100 is of a first conductive type having an N-type dopant or a P-type dopant. In the present embodiment, the substrate 100 is the P-type substrate, for example.

The doped regions 102 and 104 are of a second conductive type and are separately disposed in the substrate 100 within an active region 114. The doped region 102 serves as a source line, while the doped region 104 serves as a bit line. The doped regions 102 and 104 are formed through performing an ion implantation process, for example. Here, the second conductive type and the first conductive type have dopants of different types, and the second conductive type has the N-type dopant or the P-type dopant. In the present embodiment, the doped regions 102 and 104 are the N-type doped regions, for example.

The gate dielectric layer 106 is disposed on the substrate 100 between the doped region 102 and the doped region 104. A material of the gate dielectric layer 106 is silicon oxide, for example. The gate dielectric layer 106 is formed by performing a thermal oxidation process, for example. In the present embodiment, the gate dielectric layer 106 is uniformly formed. Namely, the dielectric layer 106 below the gate 108 and that below the gate 110 have a same thickness d1 which can be adjusted based on actual demands. In general, devices having the relatively thick gate dielectric layers are referred to as input-output (I/O) devices, whereas the devices having the comparatively thin gate dielectric layers are called core devices.

The gate 108 and the gate 110 are respectively disposed on the gate dielectric layer 106. The gate 108 is shorter than the gate 110 to lower programming voltage, and the gate 110 is long enough not to be breakdown after programming operation. A material of the gates 108 and 110 are doped polysilicon, for example. The gates 108 and 110 are formed by performing a chemical vapor deposition (CVD) process, for example.

The gate 108 is adjacent to the doped region 102. Besides, the gate 108 is electrically coupled grounded and is coupled to the doped region 102. Here, the gate 108 serves as a fuse gate which is able to trigger a breakdown effect. In the present embodiment, the gate 108 and the doped region 102 are coupled to a conductive line 120 through contacts 116 and 118. By contrast, in other embodiments, the gate 108 can be extended over the doped region 102 and then coupled to doped region 102 through the contacts.

The gate 110 is adjacent to the doped region 104 and serves as a select gate, such that the gate 110 is able to control currents entering into the OTP-ROM. Thereby, the unnecessary breakdown effects and data storage errors can be prevented. Moreover, the select gate is capable of preventing the data errors when performing a read function on the OTP-ROM.

According to the present embodiment, the gate 108 of the OTP-ROM is coupled to the doped region 102. In general, a channel under the gate 108 is in an "off" state. However, by virtue of the breakdown effects occurring between the gate 108 and the doped region 102 (a drain) and/or between the doped region 104 (a source) below the gate 108 and the doped region 102 (the drain) below the gate 108, leakage current may be generated when the current passes through the gate dielectric layer 106 between the gate 108 and the doped region 102 (the drain) and/or flows through a surface of the substrate 100 between the doped region 104 (the source) below the gate 108 and the doped region 102 (the drain) below the gate 108, in which the surface of the substrate 100 is in contact with the gate dielectric layer 106. Thereby, the channel under the gate 108 is in an "indefinitely on" state, and the OTP-ROM is programmed. For example, before the occurrence of the breakdown effects, the detected current is less than or equal to 1 pA/mm, while the detected current is less than or equal to 1 mA/mm after the occurrence of the breakdown effects. Whether the data are stored or not can be determined based on the significant increase in the current read by the OTP-ROM.

The method of programming the OTP-ROM is under the conditions that a voltage of the doped region 104 is higher than a voltage of the doped region 102, the voltage of the gate 110 is higher than a threshold voltage to pass the voltage of the doped region 104, and the doped region 102 and the substrate 100 are at a reference voltage.

In an alternative, the method of programming the OTP-ROM is under the conditions that a voltage of the doped region 104 is higher than a voltage of the doped region 102, the voltage of the gate 110 is higher than a threshold voltage to pass the voltage of the doped region 104 on and a triggering current to be sunk by the doped region 102, and the substrate 100 is at a reference voltage.

It should be noted that the channel below the gate 108 has a channel length shorter than that of the channel below the gate 110 in the present embodiment, which leads to the occurrence of the breakdown effects and an increase in compactness of the devices. However, it should by no means limit the scope of the present invention as such. In other embodiments, the channel below the gate 108 can have the channel length equal to that of the channel below the gate 110.

According to the first embodiment, the gate dielectric layer 106 is uniformly formed. Nevertheless, in other embodiments, the gate dielectric layer 106 can be in a non-uniform in thickness.

Figure 3:
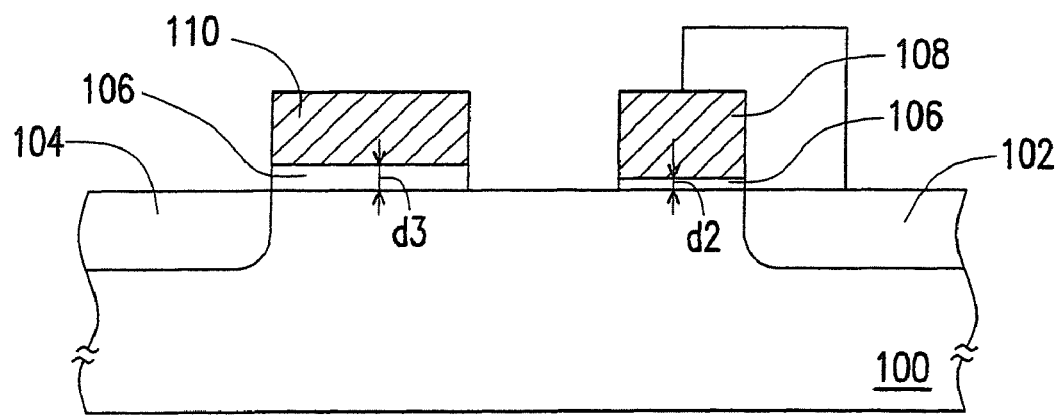
FIGS. 3 through 7 are cross-sectional views of an OTP-ROM according to a second embodiment through a sixth embodiment of the present invention.
Figure 4:
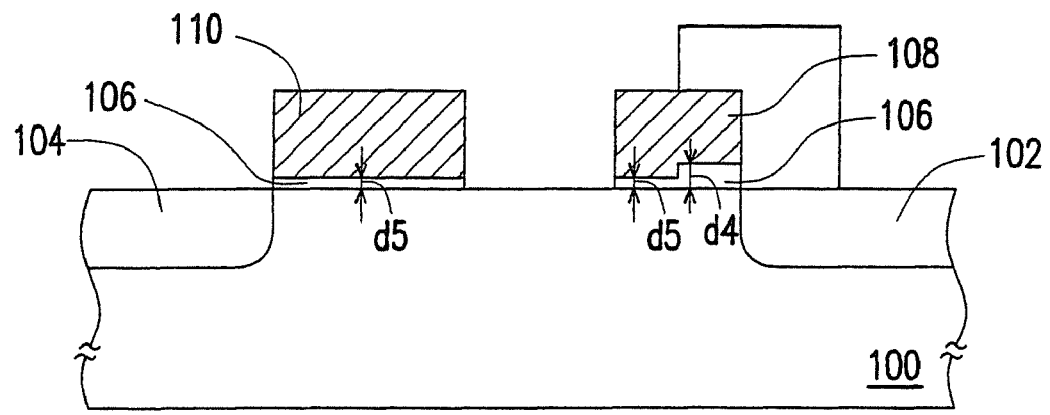
Figure 5:
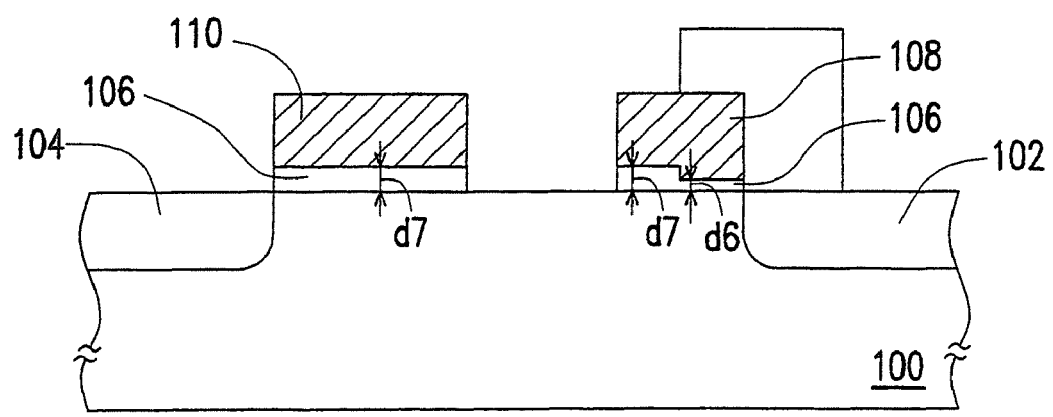

FIGS. 3 through 5 are cross-sectional views of an OTP-ROM according to a second embodiment through a fourth embodiment of the present invention. The embodiments illustrated in FIGS. 3 through 5 are described hereinafter.

Referring to FIG. 3, in the second embodiment, the gate dielectric layer 106 has a thickness d2 and a thickness d3. The gate dielectric layer 106 having the thickness d2 is disposed below the gate 108, while the gate dielectric layer 106 having the thickness d3 is below the gate 110. Here, the thickness d2 is less than the thickness d3.

Referring to FIG. 4, in the third embodiment, the gate dielectric layer 106 disposed below the gate 108 has a thickness d4 and a thickness d5. The gate dielectric layer 106 having the thickness d4 is adjacent to the doped region 102, while the gate dielectric layer 106 having the thickness d5 is adjacent to the doped region 104. Here, the thickness d4 is greater than the thickness d5. Besides, the gate dielectric layer 106 disposed below the gate 110 has the thickness d5, for example.

Referring to FIG. 5, in the fourth embodiment, the gate dielectric layer 106 disposed below the gate 108 has a thickness d6 and a thickness d7. The gate dielectric layer 106 having the thickness d6 is adjacent to the doped region 102, while the gate dielectric layer 106 having the thickness d7 is adjacent to the doped region 104. Here, the thickness d6 is less than the thickness d7. In addition, the gate dielectric layer 106 disposed below the gate 110 has the thickness d7, for example.

In the first to the fourth embodiments, the gate 108 is coupled to the doped region 102, which is not limited in the present invention. As long as the gate 108 is electrically coupled grounded, same effects can then be achieved by the present invention.

Figure 6:
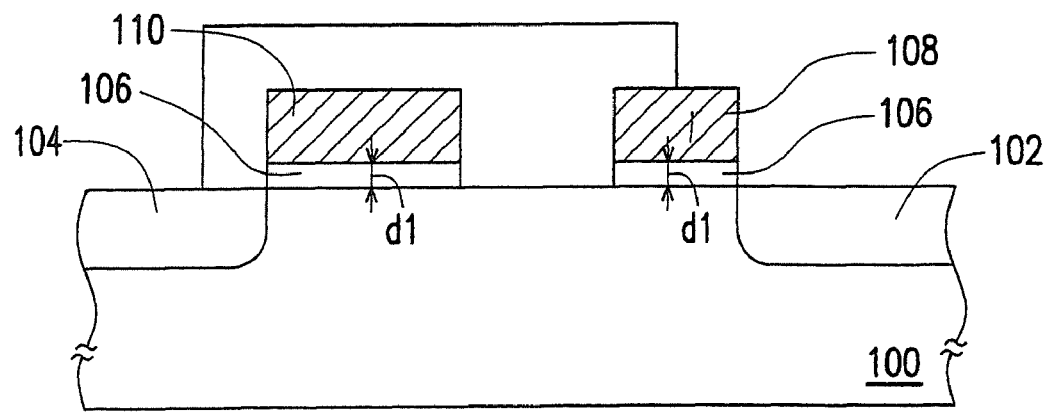
Figure 7:
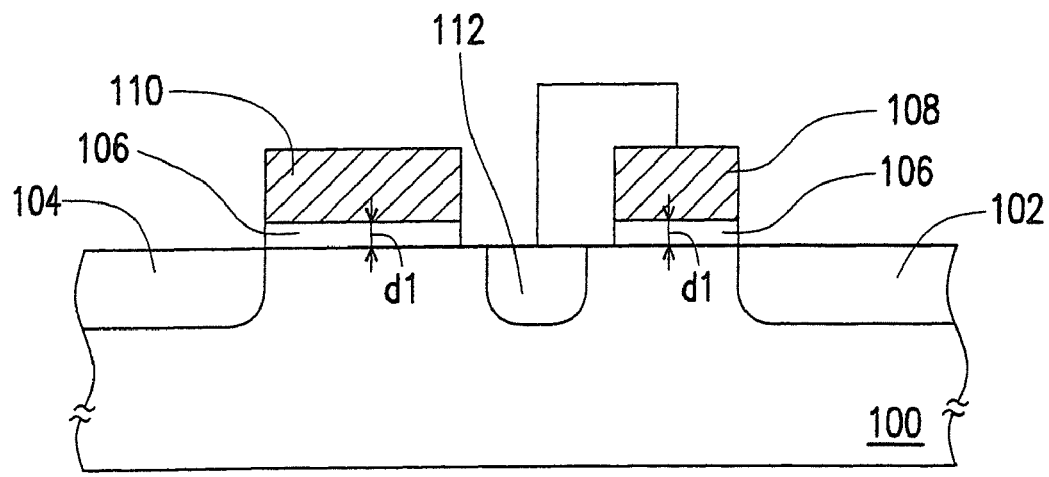

FIGS. 6 through 7 are cross-sectional views of an OTP-ROM according to a fifth embodiment and a sixth embodiment of the present invention. With reference to FIGS. 6 and 7, different ways to couple the gate 108 are described hereinafter. Note that this invention should not be construed as limited to the embodiments set forth herein.

Referring to FIGS. 2 through 6, the only difference between the fifth embodiment and the first embodiment lies in that the gate 108 depicted in FIG. 6 is coupled to the doped region 104. Aside from the above, the materials of other components, the forming methods thereof, and the performance thereof in the fifth embodiment are similar to those provided in the first embodiment, and different thicknesses of the gate dielectric layer 106 in the fifth embodiment have been elaborated in the second to the fourth embodiments. Thus, further descriptions are omitted herein.

The OTP-ROM of the fifth embodiment is programmed under the conditions that a voltage of the doped region 104 is higher than a voltage of the doped region 102, the voltage of the gate 110 is higher than a threshold voltage to pass the voltage of the doped region 104, and the doped region 102 and the substrate 100 are at a reference voltage.

Alternatively, the OTP-ROM of the fifth embodiment can also be programmed under the conditions that a voltage of the doped region 104 is higher than a voltage of the doped region 102, the voltage of the gate 110 is higher than a threshold voltage to pass the voltage of the doped region 104 and a triggering current to be sunk by the doped region 102, and the substrate 100 is at a reference voltage.

Referring to FIGS. 2 through 5 and FIG. 7, the OTP-ROM of the sixth embodiment further includes a doped region 112 which is of the second conductive type disposed in the substrate 100 between the gate 108 and the gate 110, but not aligned with the gate 108 and the gate 110. The second conductive type may have the N-type dopant or the P-type dopant. In the present embodiment, the doped region 112 is the N-type doped region, for example. The only difference between the sixth embodiment and the first embodiment lies in that the gate 108 depicted in FIG. 7 is coupled to the doped region 112. Aside from the above, the materials of other components, the forming methods thereof, and the performance thereof in the sixth embodiment are similar to those provided in the first embodiment, and different thicknesses of the gate dielectric layer 106 in the sixth embodiment have been elaborated in the second to the fourth embodiments. Thus, further descriptions are omitted herein.

The OTP-ROM of the sixth embodiment is programmed under the conditions that a voltage of the doped region 102 is higher than a voltage of the doped region 104, the voltage of the gate 110 is higher than a threshold voltage to pass the voltage of the doped region 104, and the doped region 104 and the substrate 100 are at a reference voltage.

Alternatively, the OTP-ROM of the sixth embodiment can also be programmed under the conditions that a voltage of the doped region 102 is higher than a voltage of the doped region 104, the voltage of the gate 110 is higher than a threshold voltage to pass the voltage of the doped region 104 and a triggering current to be sunk by the doped region 104, and the substrate 100 is at a reference voltage.

On the other hand, the method of reading the OTP-ROMs of aforementioned embodiments is under the conditions that a voltage of the doped region 104 is set at a reading voltage, the voltage of the gate 110 is higher than a threshold voltage to pass the voltage of the doped region 104, and the doped region 102 and the substrate 100 are at a reference voltage.

Alternatively, the method of reading the OTP-ROMs of aforementioned embodiments is under the conditions that a voltage of the doped region 102 is set at a reading voltage, the voltage of the gate 110 is higher than a threshold voltage to pass the voltage to doped region 104, and the doped region 104 and the substrate 100 are at a reference voltage.

In summary, the above embodiments have at least the following advantages.

The OTP-ROM provided by the above embodiments is able to be programmed in an effective manner.

Through the OTP-ROM proposed by the above embodiments, the unnecessary breakdown effects can be prevented, and the data can be properly and correctly stored.

The OTP-ROM proposed by the above embodiments can prevent the data errors when performing the read function.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method for operating a one-time programmable read-only memory (OTP-ROM), wherein the OTP-ROM comprises:
    a substrate which is of a first conductive type;
    a first doped region and a second doped region which are of a second conductive type and are separately disposed in the substrate;
    a gate dielectric layer disposed on the substrate between the first doped region and the second doped region; and
    a first gate and a second gate respectively disposed on the gate dielectric layer without a doped region between the first gate and the second gate, the first gate being adjacent to the first doped region and coupled to the first doped region, the second gate being adjacent to the second doped region, and a channel length of the first gate being shorter than a channel length of the second gate, wherein
    the first gate is electrically coupled grounded, and the OTP-ROM is programmed through a breakdown effect,
    the method comprising:
    programming the OTP-ROM under the conditions that:
    a voltage of the second doped region is higher than a voltage of the first doped region, the voltage of the second gate is higher than a threshold voltage to pass the voltage of the second doped region, and the first doped region and the substrate are at a reference voltage.

2. The method according to claim 1, comprising:
    reading the OTP-ROM under the conditions that:

a voltage of the second doped region is set at a reading voltage, the voltage of the second gate is higher than a threshold voltage to pass the voltage of the second doped region, and the first doped region and the substrate are at a reference voltage.

3. A method for operating a one-time programmable read-only memory (OTP-ROM), wherein the OTP-ROM comprises:

a substrate which is of a first conductive type;

a first doped region and a second doped region which are of a second conductive type and are separately disposed in the substrate;

a gate dielectric layer disposed on the substrate between the first doped region and the second doped region; and a first gate and a second gate respectively disposed on the gate dielectric layer without a doped region between the first gate and the second gate, the first gate being adjacent to the first doped region and coupled to the first doped region, the second gate being adjacent to the second doped region, and a channel length of the first gate being shorter than a channel length of the second gate, wherein the first gate is electrically coupled grounded, and the OTP-ROM is programmed through a breakdown effect, the method comprising:

programming the OTP-ROM under the conditions that:

a voltage of the second doped region is higher than a voltage of the first doped region, the voltage of the second gate is higher than a threshold voltage to pass the voltage of the second doped region and a triggering current to be sunk by the first doped region, and the substrate is at a reference voltage.

4. The method according to claim 3, comprising:

reading the OTP-ROM under the conditions that:

a voltage of the second doped region is set at a reading voltage, the voltage of the second gate is higher than a threshold voltage to pass the voltage of the second doped region, and the first doped region and the substrate are at a reference voltage.

* * * * *